(12) United States Patent
Topchiashvili et al.

(10) Patent No.: US 6,239,079 B1
(45) Date of Patent: May 29, 2001

(54) HIGH TEMPERATURE SUPERCONDUCTOR COMPOSITE MATERIAL

(76) Inventors: M. I. Topchiashvili, 47 77 St., Brooklyn, NY (US) 11209; A. E. Rokhvarger, 1865 Ocean Ave., #4B, Brooklyn, NY (US) 11230

( * ) Notice: Subject to any disclaimer, the term of this patent is extended or adjusted under 35 U.S.C. 154(b) by 0 days.

(21) Appl. No.: 09/408,209

(22) Filed: Sep. 29, 1999

Related U.S. Application Data

(63) Continuation-in-part of application No. 08/110,580, filed on Jul. 6, 1998, now Pat. No. 6,010,983.

(51) Int. Cl.$^7$ .......................... H01L 39/12; H01B 12/00; C04B 35/50
(52) U.S. Cl. .................. 505/124; 505/230; 505/705; 505/785; 505/812
(58) Field of Search ..................... 505/121, 124, 505/126, 230, 233, 235, 236, 238, 785, 812, 884, 887; 174/125.1

(56) References Cited

U.S. PATENT DOCUMENTS

| | | | |
|---|---|---|---|
| 4,952,554 | * 8/1990 | Jin et al. | 505/100 |
| 5,017,552 | * 5/1991 | Porcell | 505/100 |
| 5,210,071 | * 5/1993 | Lolacono et al. | 505/100 |
| 5,635,250 | * 6/1997 | Blum et al. | 427/387 |
| 5,902,774 | * 5/1999 | Muranaka et al. | 505/433 |

* cited by examiner

Primary Examiner—Mark Kopec
(74) Attorney, Agent, or Firm—I. Zborovsky

(57) ABSTRACT

A high temperature superconductor composite material capable of working at liquid nitrogen and higher temperatures K>77 has a sintered compound of intermixed components including high temperature superconductor ceramics, a silver dope, and sintering products of interaction of the superconductor ceramics and the silver dope with silicone material.

18 Claims, 2 Drawing Sheets

HIGH TEMPERATURE SUPERCONDUCTOR COMPOSITE MATERIAL

CROSS REFERENCE TO A RELATED APPLICATION

This application is a continuation-in-part of patent application Ser. No.: 08/110,580 filed on Jul. 6,1998 now U.S. Pat. No. 6,010,983.

BACKGROUND OF THE INVENTION

High temperature superconductor (HTS) ceramics discovered in the end of 1980's are very chemically active, brittle and degrade under environmental and magnetic field influences. Until now it was unknown how to avoid these disadvantages for practical use of the HTS ceramics. For example, it was unknown to make continuous and quality assured HTS wires and coils, shaped films and variously shaped products from these very fragile ceramics to produce practical and inexpensive electrical energy and electronics applications. It is believed to be clear that it is very important to develop a high temperature superconductor ceramic composite material with high workability of the raw material composition, which makes possible a cost-effective manufacture of all necessary products for Electrical and Electronics industries, avoiding disadvantages of the prior art.

SUMMARY OF THE INVENTION

Accordingly, it is an object of the present invention to provide an innovative high temperature superconductor composite material with significantly improved and increased electrical-magnetic and structural properties, such as strain tolerance and ductility, which has practically acceptable reliability and durability on the air and in working conditions at temperatures more 77 K. It is also an object of the present invention to provide a new material of this type from a workable raw material composition, which allows to make a suspension of the fine powder particles of the high temperature superconductor ceramics and silver dope in silicone rubber or silicone lacquer emulsion in toluene or acetone. An application of the workable and homogeneous suspension provides several advantages in adjusting and creatively combining known forming and thermal treatment methods and physical impacts on the composite material.

In accordance with the invention, chemical composition of raw materials, associated chemical ingredients, additives, aids and susceptors to the HTS ceramics to accommodate invented HTS composite material formulation for all potential needs of the Electrical and Electronics industries. In keeping with these objects and with others, which will become apparent hereinafter, one key feature of present invention resides, briefly stated in a high temperature superconductor composite material which comprises a sintered compound of intermixed components including high temperature superconductor ceramics, a silver dope, and sintering products of interaction of said superconductor ceramics and said silver dope with silicone material.

HTS composite material formulations include a preparation of the suspension of a HTS ceramic powder of the material selected from the group consisting of, for example, $YBa_2Cu_3O_{7-x}$ (Y—Ba—Cu—O or Y123) and $Bi_2Sr_2Ca_2Cu_3O_{10}$, a material selected from the group consisting of rubber silicone and lacquer silicone, and an ultra-fine silver powder dope. The formulations include forming a material, treating the formed material chemically, thermally, mechanically, and physically. This results in HTS composite material in a form of the final HTS product. When the material is composed of the above mentioned components and the final HTS material is produced from the above-mentioned high workable material formulation, it eliminates the disadvantages of the prior art and provides for highly advantageous practical results.

We invented a specially effective method of the mix preparation of solid ceramics and metal additive particles in order to form ceramics materials of various types and shapes comprising of the wet method of the preparation and application of the ceramic slurry in polymer emulsion of the silicon rubber in toluene or acetone solvent if applied ceramics degrade in water suspension and/or at open air exposure during forming.

The following methods can be used to make corresponding materials and products:
- adhesive coating of the continuous filament substrate core by the invented material suspension to produce continuous HTS filaments for combining wires, coils, and cables;
- adhesive coating of the continuous tape substrate by the invented material suspension to produce continuous HTS tapes for combining wires, coils, and cables;
- film casting on a silver or quartz glass chip-like substrate to produce some HTS electronics elements and devices;
- spraying or spattering of the invented suspension on the large-size substrate surface, producing, for example, HTS radar screens.

Also there can be used:
- extrusion or injection molding of the plastic mass from condensed suspension to produce, for example, long-length HTS rods, tubes, rails or beams;
- ordinary or hot isostatic pressing of the material from condensed suspension to produce products with complicated or particular shapes, such as tablets, rings, tile, bolls, 3D device details, etc.

Silicone does not interact with copper, barium, and rare earth oxide containing ceramics and moreover silicone prevents degradation of the high temperature superconductor properties of the high temperature superconductor ceramics.

When HTS ceramic powder and silicone polymer and silver dope are heated, silicone components are subjected to destruction and organic radicals are tom out from silicon, which leads to the formation of silicon, silica and carbon crystals. Then, silica reacts with carbon to form silicon carbide and gas: $SiO_2 + 3C \rightarrow SiC + 2CO\uparrow$.

The silicon carbide, silicon, silica and carbon are uniformly distributed in the composite material body. Additionally, during high temperature thermal treatment some components of the composite ceramic material interact with the silica and carbon, so as to form different composites, for example $Ba_2SiO_4$, SiC, etc. It was confirmed by an X-ray phase analysis.

The silicone residuals and products of their reactions with each other and ceramic components together with the silver dope significantly increase electrical conductivity and magnetic field resistance of the superconductor composite. The silicone residuals and products of their reactions are also ceramic sintering aid and microwave susceptors. Additionally, these residuals and products of their reactions together with silver dope prevent degradation of superconductor ceramic products, provide ductility and increase flexibility of the shaped product. This is a physical-chemical phenomenological discovery, which results in this invention.

As the Ginzburg's physical theory explains, the scientific phenomena discovered and employed in this invention is the cause of the superior electrical-magnetic properties of the invented composite material. This theory says that particular micro impurities can improve superconductor properties of high temperature superconductor ceramics. Silicone residuals and products of their high temperature reactions and silver dope play a role of such especially useful impurities, which actually are additives. They pin electrical current vortexes significantly increasing electrical conductivity of the HTS ceramics.

Homogeneous distribution of the solid micro-particles of the ceramic and silver powders in liquid silicone-based carrier emulsion causes a homogeneous suspension, making possible homogeneous and uniform adhesive precipitation cladding of the solid particles on the silver or quartz filament or tape substrate. The same ceramics-silver-silicone suspension can be dried and polymerized, which cause densification or condensation of the above-mentioned suspension into a plastic mass. This mass is suitable for an application of the pressing or extrusion forming methods. Thus, silicone-containing emulsion provides both formability of high temperature superconductor material working as a liquid carrier and as a plastic binder. This silicone binder keeps formed cladding film or a shape of the bulk product in a stable form up to the time period of polymerization and sintering processes that provide final hardening of the products.

Invented raw material composition is highly suitable for industrial conveyer and cost-effective mass production of the superior and quality assured HTS composite material. This material composition can be used for forming a continuous superconductor wire, coil and broad range of products for electrical and electronics industries.

Employing the same suspension of the above mentioned composition of the raw materials, it is possible to manufacture three groups of the final HTS products that actually cover all known and potential product demands of the Electrical and Electronics industries and applications of their products in various world-wide techniques:

various large-size products, for example, radar screen-shields, continuous bars and beams for levitation vehicles and other devices, electrical energy storage wheels, and non-noisy and non-wear bearings;

various films, super-tiny and precisely shaped electronic products, for example, chip elements for super-capacity and super-speed computers, controllers, the third generation of the wireless telephone, which will be suitable for Internet and image translation, underground telephone, supersensitive electronic devices for different applications, including medical needs, etc.;

continuous filament or tape combined wire, coil and cable of any electrical engineering design and nomenclature, for example, for high power electrical distribution net and smaller and power motors, generators, transformers, super-stable and super-power magnets, for example, for MRI diagnostic system and an accelerator of the elementary physical particles.

The novel features, which are considered as characteristics for the present invention, are set forth in particular in the appended claims. The invention will be understood from the accompanying drawings.

BRIEF DESCRIPTION OF THE DRAWINGS

FIG. 1 is a view showing an example of a base for HTS electronic chip with a one-layer HTS film where 1 is a chip substrate, 2 is one-layer HTS film from invented HTS composite material.

FIG. 2 is a view showing an example of a base for HTS electronic chip with a multi-layer HTS film where 1 is a chip substrate, 3 is 3D HTS multi-layer film from invented HTS composite material.

FIG. 3 is a view showing an example of a large-size HTS screen on a bulk shaped substrate where 4 is a bulk shaped substrate, 5 is HTS layer from invented HTS composite material FIG. 4 is a view showing an example of a continuous HTS filament or wire on filament core substrate where 6 is filament core substrate, 7 is HTS layer from invented HTS composite material FIG. 5 is a view showing an example of a construction of a continuous HTS tape where 8 is tape substrate, 9 is HTS layer from invented HTS composite material FIG. 6 is a view showing examples of a long-length extruded HTS bulk structure where 10 is HTS bulk structures with simple and symmetrical shape from invented HTS composite material:

a-rod, b-beam, c-tube or capillary, d-rail, and e-cup.

Figure 1:
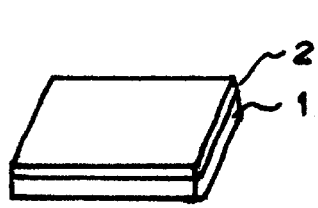
FIGS. 1–7 show that a high temperature superconductor (HTS) composite material can be in form of coated substrate elements from the group consisting of a filament, a wire, a tape, a coil, a chip, and a screen and articles from the group consisting of long-length and different bulk-shaped structures that do not apply substrates.
Figure 2:
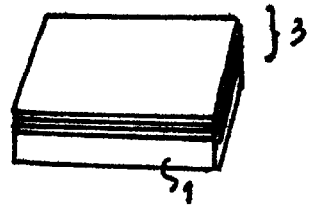
Figure 3:
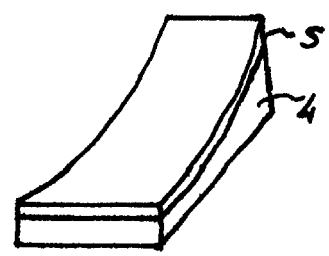
Figure 4:
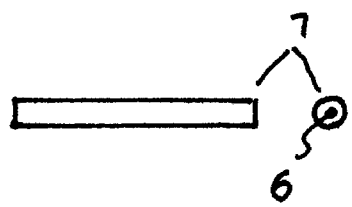
Figure 5:
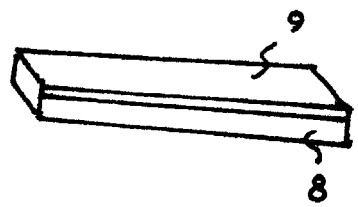
Figure 6:
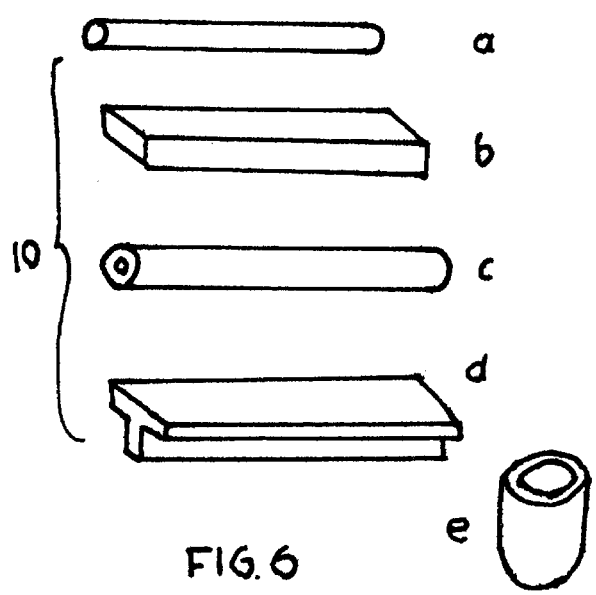
Figure 7:
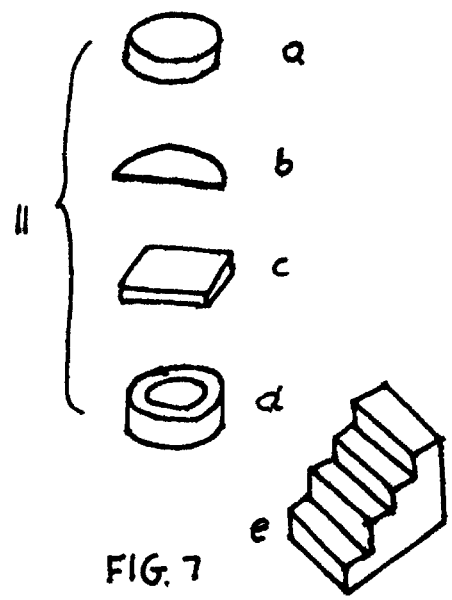

FIG. 7 is a view showing examples of a pressed and hot isostatic pressed HTS bulk structure where 11 is HTS bulk structures with simple and complicated shapes from invented HTS composite material:

a-tablet, b-lens, c-tile, d-ring, and e-rungs.

Figure 8:

FIG. 8 is a photograph of the microstructure of the invented HTS material composition after polymerization hardening process. The photograph is produced by electronic microscope from a replica of the sample of the HTS composite material with magnification factor 6,000 and further photo enlargement in 10–12 times. This figure shows small-size silicone products, probably SiC, between significantly larger particles of Y123 ceramics. SiC micro-particles provide better contacts of the sintered ceramic particles, i.e., increasing material integrity, which is important for electrical current flow. SiC micro-particles also prevent degradation of ceramic particles, isolating them from outside environment, which significantly increases strain tolerance, ductility, reliability and durability of the invented HTS composite material during both time-periods: technological treatment and service in the end products. FIG. 8 also shows cloud-like silicone agglomerations of a helix shape, laid by silicone-polymer binder.

DESCRIPTION OF THE PREFERRED EMBODIMENTS

A material in accordance with the present invention is based on an integration of two scientific and engineering discoveries that make possible an appropriate formulation of the HTS composite material on the base of HTS raw material ceramic powder.

The first discovery is as follows. After firing and hardening (sintering) of the HTS ceramics formed with of silicone, the invented HTS composite material keeps silicone residuals, including SiC micro-crystals and products of the thermo-chemical reactions of this residuals and silicone components with different oxides of the HTS ceramics. These residuals and products with a specifically determined percentage of Ag powder are homogeneously distributed within the HTS ceramic body. These additives of the HTS composite material significantly increase electric conductivity and magnetic resistance and they also sufficiently increase and improve compressive and tensile strengths, ductility, and ambient resistance of HTS composite material and its shaped (formed) products.

The second and concurrent scientific discovery consists of the application of a basic principle of Materials Science and Ceramic Engineering. Only liquid state suspension can cause homogeneous and uniform distribution of the solid particles in the volume of the liquid carrier. This automatically causes, for example, homogeneous precipitation on and adhesive coating of the substrate plate, filament or tape. Vaporization-densification and polymerization of the homogeneous solid particle dispersion into a ceramic mass should produce a homogeneous particle compound with a silicone binder, which should be suitable for an extrusion or pressing.

In accordance with the present invention a HTS composite material consists of a sintered compound of a HTS ceramics, silver dope, and sintering residuals and products of the silicone material selected from the group consisting of rubber silicone and lacquer silicone.

All cost effective forming methods result in high workability, adaptability for different products, reliable quality and process control of scrap-free manufacturing. This makes it possible to produce all necessary HTS materials and end products for Electrical, Electronics and Internet industries.

FIGS. 1–7 show that a high temperature superconductor (HTS) composite material can be in form of coated substrate elements from the group consisting of a filament, a wire, a tape, a coil, a chip, and a screen and articles from the group consisting of long-length and different bulk-shaped structures that do not apply substrates.

FIG. 8 is a photograph of the microstructure of the invented HTS material composition after polymerization hardening process. The photograph is produced by electronic microscope from a replica of the sample of the HTS composite material with magnification factor 6,000 and further photo enlargement in 10–12 times. This figure shows small-size silicone products, probably SiC, between significantly larger particles of Y123 ceramics. SiC micro-particles provide better contacts of the sintered ceramic particles, i.e., increasing material integrity, which is important for electrical current flow. SiC micro-particles also prevent degradation of ceramic particles, isolating them from outside environment, which significantly increases strain tolerance, ductility, reliability and durability of the invented HTS composite material during both time-periods: technological treatment and service in the end products. FIG. 8 also shows cloud-like silicone agglomerations of a helix shape, laid by silicone-polymer binder.

Silicone residuals and products of their reactions with HTS ceramic compound inhibit degradation of superconductor properties of the HTS composite material under impacts of the natural atmospheric $CO_2$ and $H_2O$ gases and nitrogen or oxygen coolants. As the result, HTS composite material keeps superconductor electrical and magnetic properties after 800–1,000 cyclic submerges in-out liquid nitrogen in comparison with known HTS ceramics that lose their superconductor properties after 100–140 submerges into liquid nitrogen.

The invented high temperature superconductor composite material is a material which works at liquid nitrogen and higher temperatures K>77 with critical current density $J_c>10^4 A/cm^2$ and value of critical magnetic field $H_c$ within the range of 0.1–30 Tesla. In particular, it can work with the critical current density $J_c$ of $10^5 A/cm^2$–$10^6 A/cm^2$. The new high temperature superconductor (HTS) composite material in accordance with present invention has specific impact strength within the range of 0.5–2 kg.cm/cm², and a long-time durability compatible with a conventional metal wire at working temperatures and conventional ambience.

In the new material the synthetic silicone rubber or lacquer has molecular weight in the range of 20,000–800,000, such as a synthetic silicone rubber HO—[—Si(CH$_3$)$_2$O—]—H with a molecular weight 30,000–40,000, and this synthetic silicone rubber or lacquer should be presented in an emulsion of the components in the mass ratio 2%–20%, for example, 4%–6%.

If a silicone rubber is used, the suspension mixture should include diethylaminmethylthrietoxisilane in a ratio of 3%–10%, for example, five weight percent of the weight of the silicone rubber, to accelerate vulcanization process of the silicone rubber.

The shaping of the HTS material can be performed either by direct applying of the above suspension, for example, by using chemical-adhesive coating method or by pressure of the mass condensed from the same suspension. Pressure can be provided, for example, at 300 MPa either at a room or high temperature, such as 800° C.

The forming methods to produce a continuous high temperature superconductor filament or tape include a use of the substrate filament or tape. Substrate materials are selected from the group consisting of a metal or alloy, for example silver, or quartz glass or ceramics or carbon fiber or carbon fiber fabric or glass-like carbon. Then we provide coating a surface of the substrate by at least one layer of the HTS compound material; processing the coating substrate by a process selected from the group consisting of chemical processes, physical processes and thermal processes, using a conveyor consequence of the steps; and sheathing of the thusly produced product with a material selected from the group consisting of a polymer material and/or a metal sheath.

An adhesive primer layer is applied on the filament or tape substrate. The substrate filament or tape can be also composed of silver or quartz glass. Then a high temperature superconductor composite material based on suspension mixture of high temperature superconductor ceramics with silicon-organic polymer and silver powder dope is clad on the adhesive layer, and finally a protective layer of silicone or another material could be applied.

The method further includes precipitating an adhesive primer based on epoxy lacquer or pitch with an addition of a silver powder and a polymerization aid on the filament or tape based on the quartz glass or metal, which should be silver or, for example, annealed nickel.

Furthermore a suspension mixture of three above mentioned major components of the high temperature superconductor composite material is produced while a solvent for silicone emulsion is either toluene or acetone.

The invented material preparation method includes adhesive cladding of superconductor compound layer on the mentioned above adhesive primer layer from the mentioned above suspension.

The invented material preparation method includes finally hardening of the high temperature superconductor filament or tape by ceramic sintering in an electrical furnace during 1–20 hours in excess of air or oxygen flow at 700–1200° C. (for example, 800–950° C. if we use Y—Ba—Cu—O ceramic composite). Otherwise final hardening of the high temperature superconductor filament or tape cladding layer is provided by ceramic sintering in a microwave supported electrical furnace during 1–60 minutes in excess of air or oxygen flow at 700–850° C. for Y—Ba—Cu—O ceramic composite.

The thusly-produced high temperature superconductor filaments or tapes are compacted and twisted to form a designated high temperature superconductor wire. A silicone polymer covering to perform sheathing and a sealing of the high temperature superconductor wire is provided by applying a vulcanization technique. Otherwise the high temperature superconductor wire can be stretched through copper, silver or another capillary or a tube. Finally, the flexible HTS wire can be wound in a coil or combined into a cable.

The special advantage of the proposed invention is a high workability and formability of the invented raw material composition. It makes it possible to provide conveyor production of the quality assured high temperature superconductor products for all areas of the possible application of the high temperature superconductors using the same composition of the raw materials in the same form of the suspension (superconductor compound suspension). The suspension composition includes three major components. There are HTS ceramic powder, silicone emulsion in toluene or acetone solvent, and silver powder dope.

Thus, the first step is preparation of the raw materials composition suspension and making it ready for use of all additives and ingredients. The typical second step is shaping or forming of the green material. Third step includes a few physical and thermal treatments of the shaped green material And fourth step consists of a high temperature sintering process, which converts green material into useful HTS composite material.

Six shaping (forming) methods can be used, including:

1) and 2) Adhesive coating (cladding) of powder compound suspension on metal or alloy or silver or ceramics or quartz glass or carbon fiber or carbon fiber fabric filament or tape substrate to produce continuous HTS filaments or tapes that can be further combined in wire, coil and cable. These products have to satisfy requirements of all traditional electrical engineering applications, such as smaller and powerful electrical motors, generators, turbine rotors, transformers, distribution nets and some innovative or unique advanced applications, such as storage magnet energy systems (SMES), MRI, and super-power magnets for physical particle accelerator.

3) Molding (casting) of one or several thin film layers of the invented HTS suspension on metal or alloy or silver or ceramics or quartz glass or carbon fiber or carbon fiber fabric substrate to produce two or three-dimensional high temperature superconductor films. The structure of the HTS film can copy the substrate shape structure or its buffer layer. Otherwise, a laser can burn out an especially precise high temperature superconductor two- or three-dimension structure of the electronic elements. The films can be applied, for example, for super-capacity memory and super high-speed elements of computers and controllers, various supersensitive electronic devices, such as wireless and underground telephone systems and their use for Internet and imaging translation.

4) Spraying, spattering or casting (molding) of the invented HTS composite suspension on metal or alloy or silver or ceramics or quartz glass or carbon fiber fabric or glass-like carbon substrate surface of the large perimeters to produce radar screens, super-sensitive and superpower radio antennas and telescopes.

5) An extrusion or injection molding of the condensed plastic mass from the invented HTS composite suspension to produce large size and long-length HTS products, such as rods, beams, rails and plates for levitation bases and durable energy storage wheels.

6) Ordinary pressing at room temperature or hot isostatic pressing of the condensed plastic mass from the invented HTS composite suspension to produce similar products that listed in above point 5 as well as products with particular shape, for example, tablets or disks.

Five examples of the raw material compositions of the invented HTS composite suspensions that are suitable to produce various HTS composite materials and different products presented herein below.

EXAMPLE 1

A raw materials composition includes:

a superconductor ceramic powder $YBa_2Cu_3O_7$—92.5 weight parts;

organo-silicate elastomer or silicone rubber HO—[—Si$(CH_3)_2$O—]—H—5 weight parts;

dialkylaminomethyltrialkoxysilane—5 weight percents from the weight of the silicone rubber, which is polymerization aid;

silver powder—2.5 weight parts; all in a toluene solution.

EXAMPLE 2

A raw materials composition includes:

a superconductor ceramic powder $YBa_2Cu_3O_7$—92.5 weight parts;

polyvinyldimethylsiloxane rubber—5 weight parts;

dialkylaminomethyltrialkoxysilane—4.5 weight percents from the weight of the silicone rubber, which is polymerization aid;

silver powder—2.5 weight percent;

all in a toluene solution, 300 weight percents of toluene from the weight of the silicone rubber.

EXAMPLE 3

A raw materials composition includes:

a superconductor ceramic powder $YBa_2Cu_3O_7$—92.5 weight parts;

HO—[—Si$(CH_3)_2$O—]—H—2.5 weight parts;

polyvinyldimethyl silcoxane rubber—2.5 weight parts;

dialkylaminomethyltrialkoxysilane—5 weight percents from the weight of the silicone rubber, which is polymerization aid;

silver powder—2.5 weight percent;

all in an toluene solution; 200 weight percents of toluene from the weight of the silicone rubber.

EXAMPLE 4

A raw materials composition includes:

a superconductor ceramic powder $Bi_2Sz_2Ca_2Cu_3O_{10}$—92.5 weight parts;

organo-silicate elastomer rubber HO—[—Si$(CH_3)_2$O—]—H—5 weight parts;

dialkylaminomethyltrialkoxysilane—5 weight percents from the weight of the silicone rubber, which is polymerization aid;

silver powder—2.5 weight parts; all in a toluene solution.

EXAMPLE 5

A raw materials composition includes:

a superconductor ceramic powder $Bi_2S_zCa_2Cu_3O_{10}$—92.5 weight parts;

HO—[—$Si(CH_3)_2O$—]—H—5 weight parts;

dialkylaminomethyltrialkoxysilane—5 weight percents from the weight of the silicone rubber, which is polymerization aid;

silver powder—2.5 weight parts;

all in a toluene solution, 400 weight percents of toluene from the weight of the silicone rubber.

A formulation of the HTS ceramic composite material to produce high temperature superconductor filament is illustrated by the following example.

EXAMPLE 6

A silver filament with the thickness of 125 microns is degreased by acetone, then immersed into a bath with epoxy silicone lacquer dissolved in acetone with the silver powder, hardened by malein or phtalein anhydride (30–35 weight parts from the weight of the epoxy resin, hardened at temperature of 130° C.). Then the filament is transferred from the bath and immersed into a next bath vessel with a suspension consisting of a powder of yttrium ceramics (Y—Ba—Cu—O), silicone polymer emulsion in toluene mixed by ultrasound mixer and silver in form of powder. Then the filament is removed from the bath and orientation of the particles of polymer-ceramic in a magnetic field of 8 Tesla is provided. Then the filament with the applied and oriented coating is introduced into a thermostat with heating from 100 to 320° C. during 0.5 hour. In order to increase the stability of the properties of the filament to action of magnetic fields, the filament is subjected to irradiation treatment with the dose of $5.10^4$ Gy. Then, the filament is sintered in a microwave furnace at the temperature of 940° C. in oxygen flow during 5 hours.

A material formulation to produce a HTS composite material in form of a solid disk is illustrated by the following example.

EXAMPLE 7

A silicon-organic rubber is dissolved in toluene, polymerizing agents are introduced into the mixture, the mixture is stirred, the polymeric component of the material is mixed with the ceramics and silver in a corresponding ratio in a glass or ceramic vessel and slowly heated at small vacuum impact until the solvent is evaporated and uniform mixture is produced by ultrasound and stirrer. The obtained mixture is additionally dried and introduced into a press mold and pressed with the pressure of 300 MPa in a magnetic field of 1–10 Tesla. Then the product is removed from the press mold, and after 24 hours of soaking is subjected to a thermal treatment at 100° C.—1 hour, 120° C.—1 hour, 150° C.—1 hour, 200° C.—1 hour. In order to impart superconductor properties to the product, it is sintered at a temperature of 950° C. in air atmosphere or in oxygen flow during 24 hours. A product can be made, for example, in form of disc or tablet, with a diameter of 30 mm and thickness 3–4 mm.

EXAMPLE 8

The invented material based on the bismuth ceramics $Bi_2Sr_2Ca_2Cu_3O_{10}$ was produced in a similar way, as it is described in Example 7. However, in order to impart to the product the superconductor properties the sintering of the product was performed at temperature 1000–1100° C. in air atmosphere during 21 hour.

It will be understood that each of the elements described above, or two or more together, may also find a useful application in other types of materials differing from the types described above.

While the invention has been illustrated and described as embodied in high temperature superconductor composite material, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A high temperature superconductor composite material capable of working at liquid nitrogen and higher temperatures K>77, comprising a sintered compound of intermixed components including high temperature superconductor ceramics, a silver dope, and sintering products of interaction of said superconductor ceramics and said silver dope with silicone material.

2. A high temperature superconductor composite material as defined in claim 1, wherein said high temperature superconductor ceramics is $YBa_2Cu_3O_{7-x}$ ceramics.

3. A high temperature superconductor composite material as defined in claim 1, wherein said high temperature superconductor ceramics is $Bi_2Sr_2Ca_2Cu_3O_{10}$ ceramics.

4. A high temperature superconductor composite material as defined in claim 1, wherein said silicone material is rubber silicone.

5. A high temperature superconductor composite material as defined in claim 1, wherein said silicone material is lacquer silicone.

6. A high temperature superconductor composite material, as defined in claim 1, wherein said high temperature superconductor composite material comprises said sintering products with 0.1–5.0% weight of total material weight.

7. A high temperature superconductor composite material, as defined in claim 1, wherein said high temperature superconductor composite material comprises said silver dope in a form of ultrafine powder with 0.5%–15% weight of total material weight.

8. A high temperature superconductor composite material, as defined in claim 1, wherein said high temperature superconductor composite material is in a form of an element selected from the group consisting of a continuous filament, a wire and a tape or a coil, a chip, a screen, a short bulk-shaped structure, a ring, a disk, a tablet, a long-length bulk-shaped structure, a rod, a beam, a tube, and a rail.

9. A high temperature superconductor composite material, as defined in claim 1, wherein a suspension mixture of said high temperature superconductor ceramic powder and said silver powder in silicone emulsion in toluene or acetone solvent is in a form of at least one layer or one film-layer adhesive coating, cladding or spraying said high temperature superconductor composite material on a continuous metal, or an alloy, or a silver, or ceramics or quartz glass or carbon fiber or carbon fiber fabric substrate element selected from the group consisting of a filament, a wire, and a tape.

10. A high temperature superconductor composite material, as defined in claim 1, wherein a suspension mixture of said high temperature superconductor ceramic powder and said silver powder in silicone emulsion in toluene or acetone solvent is in a form of at least one layer or one film-layer adhesive coating, cladding or spraying or spattering said high temperature superconductor composite material on a substrate element from the group consisting of a coil, a screen, and a bulk-shaped article.

11. A high temperature superconductor composite material, as defined in claim 1, wherein a suspension mixture of said high temperature superconductor ceramic powder and said silver dope powder in silicone emulsion in toluene or acetone solvent is in a form of at least one layer or one film-layer of adhesive coating, cladding or spraying said high temperature superconductor composite material on a metal, or an alloy, or a silver, or ceramics or quartz glass or carbon fiber fabric substrate element selected from the group consisting of a chip and an electronic element.

12. A high temperature superconductor composite material, as defined in claim 1, wherein a suspension mixture of said high temperature superconductor ceramic powder and said silver powder in silicone emulsion in toluene or acetone solvent and the said suspension in the form of slurry to mold an element selected from the group consisting of a bulk-shaped article, a plate, a ring, a cup, and a disk.

13. A high temperature superconductor composite material, as defined in claim 1, wherein a suspension mixture of said high temperature superconductor ceramic powder and said silver powder in silicone emulsion in toluene or acetone solvent is in a form of condensed ceramic-plastic mass to press at room or higher temperature an element selected from the group consisting of a bulk-shaped structure, a ring, a disk, a cylinder, a vessel cup, and a tablet.

14. A high temperature superconductor composite material, as defined in claim 1, wherein a suspension mixture of said high temperature superconductor ceramic powder and said silver powder in silicone emulsion in toluene or acetone solvent is in a form of condensed ceramic-plastic mass to extrude or provide injection molding of an element selected from the group consisting of a long-length bulk-shaped structure, a rod, a beam, a tube, and a rail.

15. A high temperature superconductor composite material, as defined in claim 1, wherein said high temperature superconductor composite material is a material which works at liquid nitrogen and higher temperatures K>77 with critical current density $J_c$ at least $10^4 A/cm^2$, and value of the critical magnetic field $H_c$ within the range of 0.1–30 Tesla.

16. A high temperature superconductor composite material, as defined in claim 1, wherein said high temperature superconductor composite material keeps its superconductor properties after at least 700 cyclic submerges into liquid nitrogen in comparison with initial high temperature superconductor ceramics that lose their superconductor properties after 100–140 cyclic submerges into liquid nitrogen.

17. A high temperature superconductor composite material, as defined in claim 1, wherein said high temperature superconductor composite material has increased strain tolerance obtaining specific impact strength within the range of 0.5–2 kg.cm/cm².

18. A high temperature superconductor composite material, as defined in claim 1, wherein said high temperature superconductor composite material is a material with increased ductility that allows its cutting, polishing and drilling.

\* \* \* \* \*